United States Patent [19]

Ahmed

[11] 3,864,641

[45] Feb. 4, 1975

[54] HIGH-INPUT-IMPEDANCE AMPLIFIER

[75] Inventor: Adel Abdel Aziz Ahmed, Clinton Township, N.J.

[73] Assignee: RCA Corporation, New York, N.Y.

[22] Filed: Jan. 2, 1973

[21] Appl. No.: 320,633

[52] U.S. Cl. .......... 330/17, 330/19, 330/28, 330/30 D

[51] Int. Cl. .......... H03f 3/18

[58] Field of Search..... 330/13, 17, 19, 30 D, 38 M, 330/28

[56] References Cited

UNITED STATES PATENTS

| | | | |
|---|---|---|---|
| 3,277,385 | 10/1966 | Matsumoto | 330/17 X |
| 3,668,541 | 6/1972 | Pease | 330/17 |

*Primary Examiner*—Alfred E. Smith

*Assistant Examiner*—Lawrence J. Dahl

*Attorney, Agent, or Firm*—H. Christoffersen; S. Cohen; A. L. Limberg

[57] ABSTRACT

A high-input-impedance transistor amplifiers, requiring no high-resistance resistors, is useful in integrated circuitry. A negative feedback circuit splits a quiescent current into first and second portions in the ratio of the collector and base currents of an amplifier transistor. The first portion is supplied to the collector electrode of the amplifier transistor and the second portion is supplied to the emitter electrode of a complementary transistor and thence from the collector electrode of said complementary transistor to the base electrode of the amplifier transistor. The quiescent collector voltage of the amplifier transistor is stably maintained despite the high-impedance biasing of its base electrode.

39 Claims, 5 Drawing Figures

HIGH-INPUT-IMPEDANCE AMPLIFIER

Figure 1:
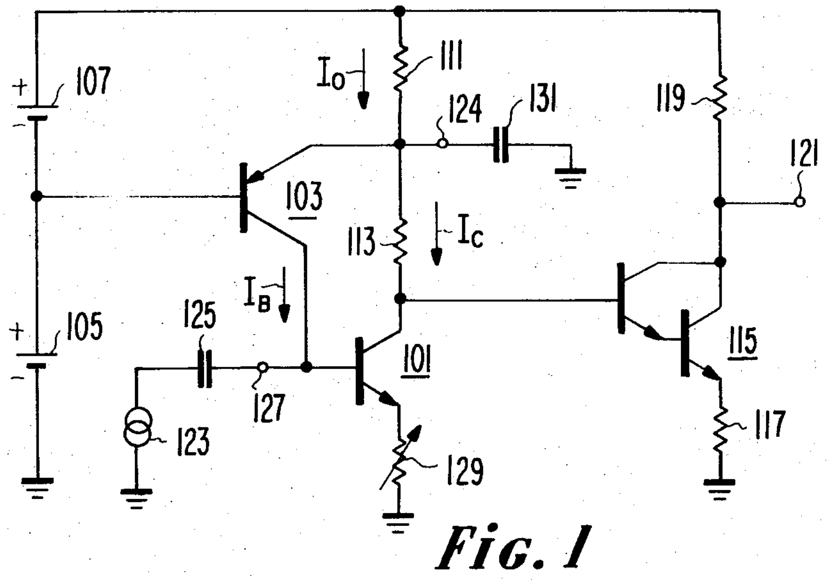

The present invention relates to high-input-impedance resistance-coupled transistor amplifiers and more particularly to such amplifiers as require no high resistance resistors.

Current-mode base biasing of a bipolar amplifier transistor with fixed base current, while it permits high input impedance at the base electrode of the transistor, is customarily avoided since it does not provide a stable quiescent collector current. Collector-to-base feedback using a resistor to couple quiescent collector potential variations to the base electrode of the amplifier transistor for reducing such variations is known from U.S. Pat. No. 2,750,456. To obtain a stable quiescent collector potential, however, the feedback resistor must have lower resistance than desired for a high-input-impedance resistance-coupled amplifier configuration.

Higher input impedance in a resistance-coupled transistor amplifier is often obtained by positive feedback, such as by capacitively coupling its emitter electrode to a portion of its base bias network. However, such prior art high-input-impedance resistance-coupled amplifiers require higher resistance resistors than may be available to the designer, particularly the designer of monolithic integrated circuitry employing bipolar transistors.

An amplifier embodying the present invention includes two transistors of complementary conductivity types. One portion of a constant current is applied to the base-emitter junction of the first transistor via the emitter-to-collector path of the second transistor and the remaining portion of the constant current is supplied to the collector-to-emitter path of the other transistor through a load. The input signal is applied to the base of the first transistor.

Figure 2:
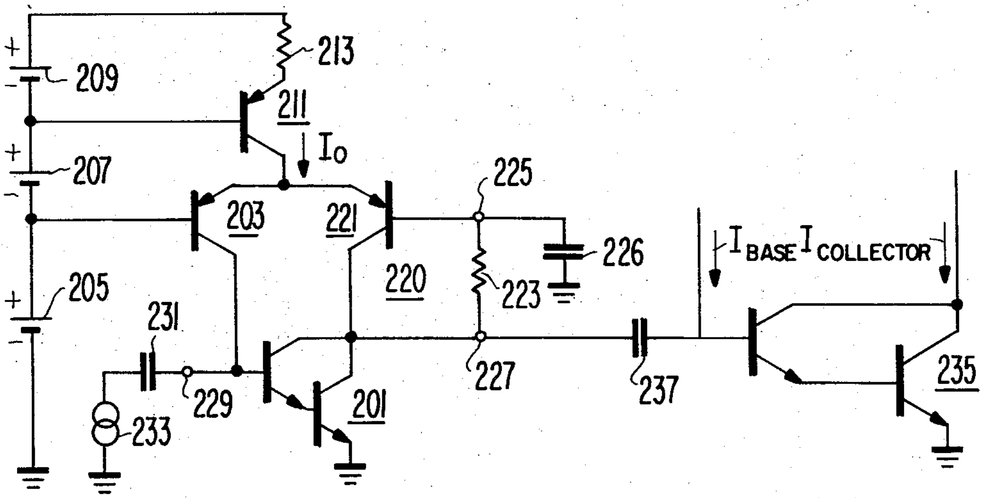
Figure 3:
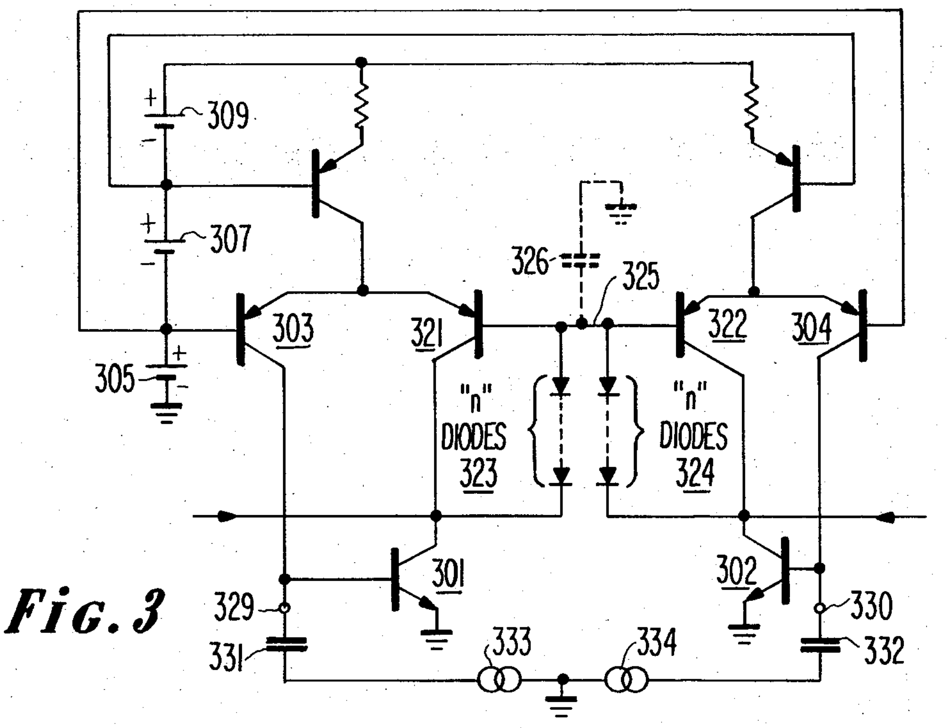
Figure 4:
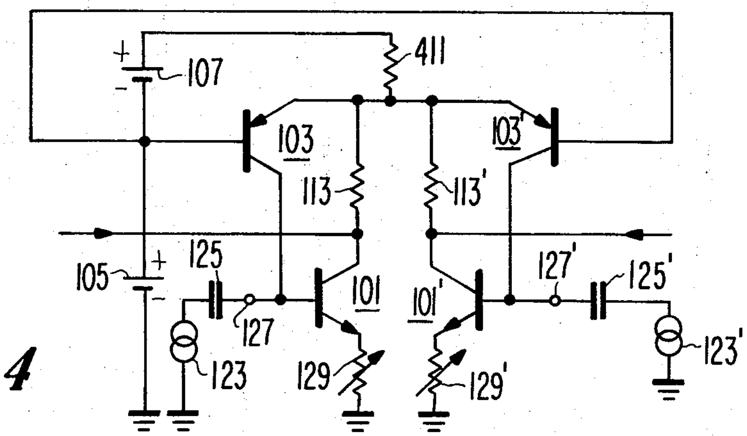
Figure 5:
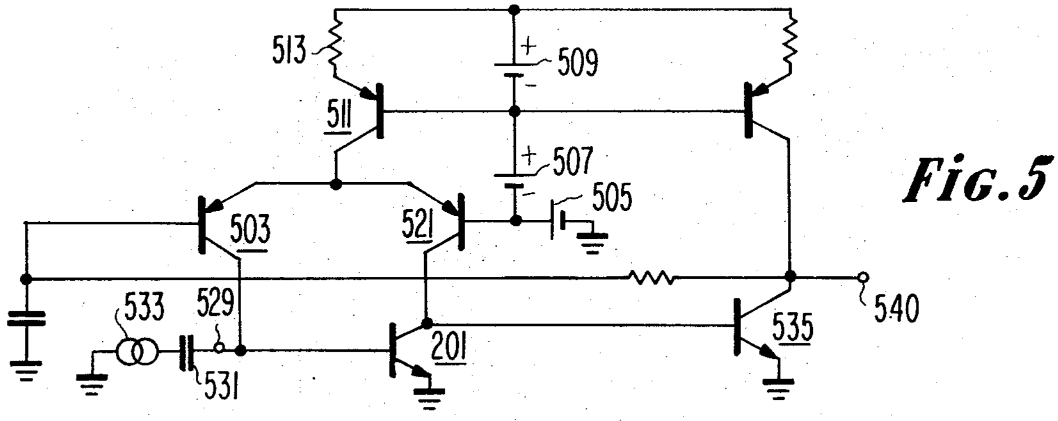

The invention will be better understood by reference to the following specification and to the drawing in which:

FIGS. 1, 2 and 5 are schematic circuit diagrams of embodiments of the present invention, each of which is a high input impedance resistance coupled amplifier for single-ended or unbalanced signals; and FIGS. 3 and 4 are schematic circuit diagrams of embodiments of the present invention, each of which is a high input impedance resistance coupled amplifier suited to amplifying balanced signals.

Referring now to FIG. 1, the transistor 101 is connected to a common-emitter transistor amplifier configuration embodying the present invention. To provide quiescent base current to transistor 101 from its collector electrode, transistor 103 must be biased for normal transistor operation. Potential sources 105 and 107 reverse-bias its collector-base junction and forward-bias its emitter-base junction, respectively.

Current flow through resistor 111 is arranged to be substantially constant. The potential afforded by source 107 ($E_{107}$) less the forward-biased base-emitter junction potential offset of transistor 103 ($V_{BE\ 103}$), a substantially constant potential, is impressed upon the resistor 111 and causes the flow of current $I_O$. This current (which may instead by produced by constant current source means) other than the one shown, essentially determines the sum of the quiescent base current $I_B$ and quiescent collector current $I_C$ of transistor 101, since the transistor 103 acts as a common base amplifier for $I_B$ with substantially unity common-base forward current gain ($\alpha$).

That is, the base current of transistor 103 is negligibly small, so by Kirchoff's Current Law:

$$I_O = I_C + I_B \quad 1.$$

The ratio of $I_C$ and $I_B$ is determined by the common-emitter forward current gain ($\beta$) of transistor 101.

$$I_C/I_B = \beta \quad 2.$$

The system maintains itself in equilibrium so that equations 1 and 2 are constantly satisfied by negative feedback.

In this equilibrium condition, cross-solving equations 1 and 2.

$$I_C = \beta/(\beta + 1)\, I_O \quad 3.$$

Should $I_C$ tend to come smaller, $I_o - I_C$, the remaining part of $I_O$, coupled to the base electrode of transistor 101 would increase. The tendency is for the increase of $I_O - I_C$ to be several times larger in proportion to itself than the decrease of $I_C$ is in proportion to itself. This is because $I_O - I_C$ is the difference between substantially larger quantities; and $I_C$ would be increased accordingly with $I_O - I_C$ (per equation 2) to regain equilibrium. Conversely should $I_C$ tend to become larger, $I_O - I_C$ decreases in substantially greater proportion to itself and $I_C$ is decreased accordingly to regain equilibrium.

If transistor 101 be a conventional transistor, its $\beta$ will exceed 30. In such instance $I_C$ substantially equals $I_O$ (per equation 3) despite variations of $\beta$. The potential drop across resistor 113, $V_{113}$, is by Ohm's Law substantially $I_O$ times its resistance, $R_{113}$. Since the emitter electrode of transistor 103 is at a well-defined potential — $E_{105}$, the potential provided by source 105, plus $V_{BE\ 103}$ — and since $V_{113}$ is well-defined, the potential at the collector electrode of transistor 101 is well defined and substantially equal to $E_{105} + V_{BE\ 103} - V_{113} = E_{105} + V_{BE\ 103} - I_O R_{113}$ despite variations of $\beta$.

In the circuit shown, if the resistances of resistors 111, 113, are equal, each has a potential drop $E_{107} - V_{BE\ 103}$, thereacross, so the collector electrode of transistor 101 is at $E_{105} + E_{107} - (E_{107} - V_{BE\ 103}) - (E_{107} - V_{BE\ 103}) = E_{105} - E_{107} + 2V_{BE\ 103}$. The $2V_{BE\ 103}$ component of this quiescent potential biasing the base electrode of the Darlington compound transistor 115 accordingly provides temperature compensation for the potential offsets of its forward-biased base-emitter junctions, causing the potential across the resistor 117 to be at $E_{105} - E_{107}$. No response to $V_{BE}$ variations will appear in the potential drop across resistor 119 so an output signal at terminal 121 could be directly coupled to yet another amplifier stage. The collector electrode of transistor 101 is not only maintained at a stable operating point, but the operating point is easily arranged to facilitate direct coupling to later stages.

Signal coupled from a signal source 123 via a coupling capacitor 125 to terminal 127 connected to the base electrode of transistor 101 is presented with an input impedance essentially that of the base-emitter circuit transistor 101 alone. The collector impedance of a grounded-base amplifier transistor such as transistor 103 is normally substantially higher than that of the base-emitter circuit of transistor 101. The signal voltage gain of the transistor 101 is determined by the ratio of its collector load resistor 113 to its emitter resistance (including its transresistance plus any external resistance 129) just as in a conventional collector-loaded transistor amplifier. There is no requirement for external emitter resistance 129 to stabilize the collector potential of transistor 101, however.

A bypass capacitor 131 decouples the collector electrode of transistor 101 from the emitter electrode of transistor 103 insofar as signal is concerned. This prevents the reduction of the input impedance at terminal 127 which would occur were there negative feedback of signal from the collector electrode of transistor 101 via the common-base amplifier transistor 103.

Referring now to FIG. 2, the compound transistor 201, a Darlington Configuration, is connected in a grounded-emitter configuration and is provided quiescent base-current from the collector electrode of transistor 203. The potential source 209 forward-biases the base-emitter junction of transistor 211 and a substantially fixed potential is applied to resistor 213 to establish a constant emitter current flow in transistor 211. The transistor 211 has a constant collector current $I_O$ in response to its constant emitter current.

The transistor 201 has a dynamic collector load resistance 220 which has a higher impedance for signal currents than for quiescent currents. The load 220 comprises a transistor 221 having its base electrode connected by a resistor 223 to its collector electrode and by-passed for signal by capacitor 226. For signal the collector load impedance is in effect the resistance $R_{223}$ of resistor 223, since the collector impedance of transistor 221 in parallel therewith is substantially larger. $R_{223}$ can be chosen to be higher in resistance than the resistance of a conventional load resistor since the collector current requirement of transistor 201 is supplied primarily via the emitter-to-collector path of transistor 221 rather than its emitter-to-base path. The reduced quiescent current flow through the load resistor 223 causes less quiescent potential thereacross, and the tendency of the transistor 201 to run short of available supply potential as its load resistor is increased is greatly decreased.

Alternatively, the resistor 223 can be chosen to have a resistance similar to that of a conventional load resistor. With small quiescent current flowing through resistor 223 and its resistance being low, the potential drop across it is small. The quiescent potential at the collector electrode of transistor 201 will then be substantially the same as that at the base electrodes of transistors 203, 221 and quite independent of variations in the current gain of transistor 221.

The collector-to-base feedback connection of transistor 221 by means of resistor 223 reduces its collector impedance substantially for quiescent current, but the by-pass capacitor 226 prevents such negative feedback for signals and maintains its collector impedance higher for them. Such signals appear at terminal 227 at the collector electrode of transistor 201 in response to input signals applied to terminal 229 at its base electrode via capacitor 231 from source 233.

The capacitor 226 performs a second function, decoupling output signal voltages from the emitter electrode of transistor 203 as coupled thereto by emitter follower action of transistor 221. Since output signal voltages are not coupled to the base-emitter junction of transistor 221, there are no variations of the emitter current of transistor 221 in response thereto to be coupled to the emitter electrode of transistor 203, either. The base and collector currents supplied to compound transistor 201 are quiescent currents free from signal variations. Transistor 201 has substantially no collector-to-base feedback for signals through the amplifier transistor 203, which maintains high input impedance at terminal 229. Input impedances as high as 3,000 to 5,000 megohms can be easily and reliably achieved with the configuration shown in FIG. 2.

The range of frequency over which the capacitor 226 provides effective by-passing can be reduced, causing the input impedance at terminal 129 to be reduced for frequencies lower than the signal frequencies. Alternatively, capacitor 226 may be replaced by a tuned trap, such as that formed by the series combination of an inductor and a capacitor to reduce the input impedance at terminal 229 for frequencies both higher and lower than signal frequencies.

The transistors 203, 221 can be viewed as being an emitter coupled differential amplifier for quiescent bias potential between their base electrodes, which differential amplifier is maintained with collector currents of transistors 221, 203 in a ratio substantially equal to the common-emitter forward current gain of the Darlington composite transistor 201 by virtue of the negative feedback connection for quiescent current between the collector and base electrodes of transistor 221. This common-emitter forward current gain usually being greater than unity even when a simple transistor is used, the collector currents of transistors 203, 221 differ, and the differential amplifier is maintained in imbalance.

A succeeding amplifier transistor 235 may be arranged to have a low input impedance by arranging for its quiescent base and collector currents ($I_{base}$, $I_{collector}$) to be higher than that of the compound transistor 201. In such case the low input impedance of the transistor 235 can provide sufficient decoupling of signal from the collector of transistor 201 to the emitter of transistor 203 to permit the omission of capacitor 226. The transistor 201 will exhibit low voltage gain, but will exhibit power gain to function as an impedance transformation amplifier.

FIG. 3 shows two amplifier transistors 301, 302 each biased similarly to transistor 201 in FIG. 2. The resistor 223 of FIG. 2 has been replaced in each stage by n diode(s) where $n$ is a positive integer 1 or greater, which provide a better defined quiescent collector potential for transistors 301, 302 than a simple resistor does. The quiescent collector-to-emitter potentials of transistors 301, 302 will be substantially equal to the potential provided by source 305 minus the sum of the potential offsets across each of the n diodes.

Since the current through the diodes is smaller than the emitter current of transistor 301 by a factor equal to the common emitter forward current gain of transistor 321 ($h_{fe\ 321}$) the resistance of each one will closely approximate $h_{fe\ 321}$ times the emitter resistance of transistor 301. These diodes can be provided by transistors of the same type as transistors 301, 302 each having its base and collector electrodes connected to form one electrode of the diode and having its emitter electrode provide the other electrode of the diode. In such case the stages shown in FIG. 3 have a signal voltage gain of $n(h_{fe\ 321})$.

The decoupling of signals at the collector electrodes of the amplifier transistor (301, 302) from the emitter electrode of the transistor providing it with quiescent base current (303, 304) needs no by-pass capacitors when a pair of amplifiers each handling signals which are anti-phase with respect to each other are used.

Rather, an opposed phase signal from one amplifier may be used to cancel signal from the other to provide a virtual ground connection for the anti-phase alternating signal currents.

The connection 325 in FIG. 3 provides such a virtual ground connection when the signals provided by sources 333, 334 are anti-phase with respect to each other. An actual capacitor 326, as shown in dotted outline, may be used to by-pass connection 225 to ground so that the amplifier will not exhibit common-mode signal rejection. Otherwise common-mode signals not being anti-phase will appear at the connection 325 and will be fed back to the base electrodes of transistors 301, 302 to degenerate those signals.

The configuration shown in FIG. 3 is well suited for construction in monolithic integrated circuit form. The PNP transistors 303, 321, 322, 304 may have lateral structure. The NPN transistors 301, 302 may have the more conventional vertical structure; and the n diodes 323, 324 may also comprise NPN transistors with joined collector and base electrodes as their anodes and with emitter electrodes as cathodes.

A similar technique, using two amplifier stages as shown in FIG. 1 in bridge configuration with their signal sources 123 providing anti-phase signals, and their terminals 124 interconnected may be used to eliminate a need for by-pass capacitors 131. FIG. 4 illustrates such a configuration. The primed numeral references refer to elements in the second amplifier stage corresponding to elements with similar unprimed numeral references in the first ampifier. The direct potential sources 105, 107 are shared by the amplifiers. The resistor 411 is also shared and its effective resistance is half that resistor 111 or 111' (herein replaced) would be.

FIG. 5 shows an embodiment of the present invention similar to that shown in FIG. 2, however compound transistor 535 of the succeeding common-emitter amplifier stage is included with the negative feedback loop maintaining the application of properly proportioned quiescent base and collector currents to the compound transistor 201. The corresponding circuit elements of FIGS. 2 and 5 share the same last two digits in their identifying numerals. To accommodate the signal inverting properties of the succeeding common-emitter amplifier stage the base electrode connections of transistors 503, 521 are reversed from those of transistors 203, 221. Such reversal is in order if other direct-coupled amplifiers with signal inverting properties replace the common-emitter compound transistor 501 in the negative feedback loop. Output signal voltages responsive to input signal voltages from the source 533 are provided at output terminal 540.

Whereas the terms base electrode, emitter electrode and collector electrode are employed in the claims the transistors claimed need not be bipolar types unless specifically claimed to be so. The terms are used because of a lack of uniform nomenclature for transistor electrodes for different types of transistor in American parlance. For instance, P-channel MOS transistors may be used to replace the PNP transistors 103, 203, 213, 221, 303 and 304, 321 and 322, or 103 and 103'. The transistors of the claims may also be composite transistors employing a plurality of transistors in their construction, such as is provided by a Darlington configuration.

What is claimed is:

1. An amplifier comprising, in combination:

first and second transistors of complementary conduction types each having base, emitter and collector electrodes, said first transistor being a bipolar type and having its emitter electrode direct current conductively coupled to a point of reference potential, said second transistor collector electrode being direct current conductively connected to said first transistor base electrode;

means for applying an input signal to said first transistor base electrode;

a load having a direct current path therethrough connected between said first transistor collector electrode and said second transistor emitter electrode; and supply means including a constant current supply connected between said second transistor emitter electrode and said point of reference potential, and means for providing a biasing potential to said second transistor base electrode.

2. An amplifier as claimed in claim 1 in which said load comprises:

a third transistor, which is of similar conductivity type to said second transistor which has emitter and collector electrodes connected respectively to said second transistor emitter electrode and to said first transistor collector electrode, the collector-to-emitter path of said third transistor thereby being serially coupled for direct current flow to that of said first transistor for providing said direct current path through said load, and which has a base electrode;

direct current conductive means for connecting the collector electrode of said third transistor to its base electrode; and means connected to said third transistor base electrode for decoupling a-c signal variations therefrom.

3. An amplifier comprising:

a source of reference potential;

a source of bias potential;

first and second transistors of dissimilar conductivity types, each having base and emitter and collector electrodes, said first transistor being a bipolar type, said first transistor emitter electrode being direct current conductively coupled to said source of reference potential, said second transistor base electrode being connected to said source of bias potential, said second transistor collector electrode being direct current conductively coupled to said first transistor base electrode and providing the sole path for direct current thereto;

a first source of current, to which said second transistor emitter electrode is connected;

means for direct current conductively coupling said first transistor collector electrode to said first source of current;

at least a first terminal for input signal, said first input terminal being connected to the base electrode of said first transistor; and means connected to said first transistor collector electrode for utilizing output signals provided thereat in response to said input signals.

4. An amplifier as claimed in claim 3 including:

means to decouple said output signals from said second transistor emitter electrode.

5. An amplifier as claimed in claim 3 wherein said source of current comprises:
resistive means connected at one end thereof to said second transistor emitter electrode, and
a second bias potential source connected between said second transistor base electrode and the other end of said resistive means.

6. An amplifier as claimed in claim 3 further including second and third bias potential sources and wherein said source of current comprises a third transistor being of similar conductivity type to said second transistor, having base and emitter electrodes between which said third bias potential source is connected and having a collector electrode connected to the second transistor emitter electrode, said second bias potential source being connected between the base electrode of said second transistor and the base electrode of said third transistor.

7. An amplifier as claimed in claim 3 wherein: said means for direct current conductively coupling said first transistor collector electrode to said second transistor emitter electrode comprises resistance means.

8. An amplifier as claimed in claim 7 further including:
a capacitance connected between a point along said resistance and a point of fixed potential with regard to said reference potential for bypassing at least a portion of said output signals.

9. An amplifier as claimed in claim 3 further including:
a third transistor being of similar conductivity type to said second transistor, having a base electrode, having collector and emitter electrodes with a current path therebetween, the emitter electrode of said third transistor being connected to the emitter electrode of said second transistor, the collector electrode of said third transistor being connected to the collector electrode of said first transistor, said current path providing said means for direct current conductively coupling said first transistor collector electrode to said second transistor emitter electrode and
resistive means connected between said collector and said base electrodes of said third transistor.

10. An amplifier as claimed in claim 1 wherein:
said resistive means includes at least one forward biased semiconductor junction.

11. An amplifier as claimed in claim 9 further including:
a capacitance connected between said third transistor base electrode and a point of fixed potential with regard to said reference potential for bypassing at least a portion of said output signals.

12. An amplifier as claimed in claim 9 further including:
a second terminal for input signal;
a fourth transistor of the same type as said first transistor having an emitter electrode direct current conductively coupled to said source of reference potential, having a base electrode connected to said second terminal, and having a collector electrode;
fifth and sixth transistors of similar types to said second and said third transistors, respectively, each having base and emitter and collector electrodes, said fifth transistor base electrode being connected to said source of bias potential, said fifth transistor collector electrode being direct current conductively coupled to said fourth transistor base electrode; the base electrodes of said third and said sixth transistors being coupled to each other, said sixth transistor collector electrode being connected to said fourth transistor collector electrode and being direct coupled to its base electrode; and
a second source of current to which the emitter electrodes of said fifth and said sixth transistors are each connected.

13. An amplifier as claimed in claim 3 further including:
a second terminal for input signal;
a third transistor of the same type as said first transistor, having an emitter electrode direct current conductively coupled to said reference potential, having a base electrode connected to said second terminal, and having a collector electrode;
a fourth transistor of the same type as said second transistor, having a base electrode connected to said source of bias potential, having a collector electrode direct current conductively coupled to said third transistor base electrode and having an emitter electrode diret current conductively coupled to said first source of current; and
means for direct current conductively coupling said third transistor collector electrode to said fourth transistor emitter electrode.

14. A differential amplifier including a first and a second transistors of a first conductivity type and a third transistor of a second conductivity type dissimilar to said first conductivity type, each of said transistors having base and emitter and collector electrodes, said third transistor responding to applied base current to have a collector current larger than its base current by a gain factor, the emitter electrode of said third transistor being direct coupled to a point of reference potential, the base electrode of said first transistor being connected to a point of bias potential, the collector electrode of said first transistor being direct coupled to the base electrode of said third transistor, the collector electrodes of said second and said third transistors being direct current conductively coupled to each other; said differential amplifier also including a current supply connected between said point of reference potential and an interconnection of the emitter electrodes of said first and said second transistors; said differential amplifier being characterized in that:
said third transistor collector electrode is direct coupled to said second transistor base electrode to provide in combination with the aforementioned structure a negative feedback loop for quiescent current, which negative feedback loop acts to adjust the ratio of the collector current of said second transistor and the collector current of said first transistor to be substantially equal to said gain factor.

15. A differential amplifier as claimed in claim 14 wherein:
a capacitor bypasses said second transistor base electrode to said reference potential.

16. A differential amplifier as claimed in claim 14 wherein said gain factor is substantially greater than unity so said differential amplifier is maintained in imbalance with unequal quiescent collector current flows in said first and said second transistors.

17. An amplifier comprising:

a source of reference potential;

a source of bias potential;

a first transistor having base and emitter electrode with a semiconductive base-emitter junction therebetween and having a collector electrode, said first transistor emitter electrode being direct current conductively coupled to said source of reference potential;

a source of input signal connected between the base and emitter electrodes of said first transistor;

second and third transistors each of opposite conductivity type to said first transistor and each having base and emitter and collector electrodes, said second transistor collector electrode direct current conductively coupled to said first transistor base electrode providing the sole path for quiescent base current flow therethrough, said collector electrodes of said first and said third transistors being direct current conductively coupled to each other;

said third transistor base electrode connected to said source of bias potential;

a source of current direct current conductively coupled to intercoupled said emitter electrodes of said second and said third transistors;

a direct-coupled signal-inverting amplifier having an input terminal connected to said first transistor collector electrode and having an output terminal at which is provided an output signal responsive to said input signal;

means for coupling quiescent potential from said signal-inverting amplifier output terminal to said second transistor base electrode.

18. An amplifier as set forth in claim 17 wherein said means for coupling said quiescent potential from said signal-inverting amplifier output terminal to said second transistor base electrode includes a resistor connected between said signal-inverting amplifier output terminal and said second transistor base electrode.

19. An amplifier as set forth in claim 18 wherein said means for coupling quiescent potential from said signal inverting amplifier output terminal to said second transistor base electrode includes a by-pass capacitor connected between said second transistor base electrode and said source of reference potential.

20. An amplifier comprising, in combination:

an input, an output and a common terminal for signal;

first and second transistors of opposite conductivity types, each having base and emitter and collector electrodes, the base electrode of said first transistor being connected to said input terminal, the collector electrode of said first transistor being connected to said output terminal, and the collector electrode of the second transistor being direct coupled to the base electrode of said first transistor;

direct current conductive means for connecting said first transistor emitter electrode to said common terminal;

a current source having a first terminal connected to said common terminal, having a second terminal, and maintaining a predetermined level of current flow between its said first and said second terminals;

means for direct coupling the second terminal of said current source to the emitter electrode of said second transistor;

means for exhibiting impedance to signal for direct current conductively coupling the second terminal of said current source to the collector electrode of said first transistor; and means for applying a first bias potential between said common terminal and the base electrode of said second transistor of a polarity for biasing said second transistor to permit current flow via its emitter-to-collector path from said current source to the base electrode of said first transistor.

21. An amplifier as set forth in claim 20 wherein said current source comprises:

a resistive element having a first end connected to said second terminal of the current source and having a second end; and means for applying a second bias potential between said first terminal of the current source and the second end of said resistive element, said second bias potential being of the same polarity of said first bias potential and of greater magnitude.

22. An amplifier as set forth in claim 20 wherein said current source comprises:

a third transistor, having base and emitter and collector electrodes, being of the same conductivity type as said second transistor, having its collector electrode connected to said second terminal of the current source;

means for applying a second bias potential between said first terminal of the current source and said third transistor base electrode, said second bias potential being larger than said first bias potential and of the same polarity; and means for applying a third bias potential between said first terminal of the current source and said third transistor emitter electrode, said third bias potential being larger than said second bias potential and of the same polarity.

23. An amplifier as claimed in claim 20, wherein said means for direct coupling the second terminal of said current source to the emitter electrode of said second transistor consists of a direct connection.

24. An amplifier as set forth in claim 23 wherein said means for exhibiting impedance to signal for direct current conductively coupling the second terminal of said current source to the collector electrode of said first transistor comprises a resistive means.

25. An amplifier as set forth in claim 23, further including a third transistor of the same conductivity type as said second transistor, said third transistor having base and emitter and collector electrodes, said means for direct current conductively coupling of said second terminal of the current source to said collector electrode of said first transistor comprising a coupling via the emitter-to-collector path of said third transistor, and further including a feedback path connected between the collector and base electrodes of said third transistor.

26. A high input impedance amplifier as set forth in claim 25 wherein said feedback path comprises a resistor.

27. A high input impedance amplifier as set forth in claim 25 wherein said feedback path comprises a plurality of serially connected diodes, all poled in the same direction.

28. An amplifier as set forth in claim 20 wherein said means for direct current conductively coupling the second terminal of said current source to the collector electrode of said first transistor comprises:

direct current impedance means serving to direct current conductively couple the second terminal of said current source to the collector electrode of said first transistor, and a signal by-pass circuit connected between said direct current impedance means and said common terminal.

29. An amplifier as set forth in claim 28 wherein said direct current impedance means comprises the emitter-to-collector path of a third transistor, said third transistor having a base electrode connected to said point of reference potential via said signal by-pass circuit.

30. An amplifier having an input, a common and an output terminal for signal; having a first transistor with base and emitter and collector electrodes respectively connected to said input and said common and said output terminals and having a collector-to-base direct current negative feedback circuit associated with said first transistor for determining the relative values of its quiescent base and collector currents, said negative feedback circuit comprising:

a current source having a first terminal connected to said common terminal, having a second terminal, and maintaining a predetermined level of current flow between its said first and said second terminals;

a second transistor of opposite conductivity to the first transistor, having base and emitter and collector electrodes, connected at its emitter electrode to the second terminal of said constant current source, and at its collector electrode to the base electrode of said first transistor for coupling said base current to said first transistor base electrode;

means for applying bias potential between the base electrode of said second transistor and the emitter electrode of said first transistor; and a network having a path, which path is conductive for direct current but relatively non-conductive for changing signal current, connecting said first transistor collector electrode to the second terminal of said current source.

31. An amplifier as claimed in claim 30 wherein said network which has a path conductive for direct current but not for signal current comprises a resistive element connecting the collector electrode of said first transistor to the second terminal of said current source and a signal by-pass circuit connected to the emitter electrode of said second transistor to by-pass signal away therefrom.

32. An amplifier as claimed in claim 31 wherein said signal by-pass circuit comprises a capacitor connecting said second transistor emitter electrode to a point of fixed potential with respect to the potential of said common terminal.

33. An amplifier as claimed in claim 31 further including an auxiliary amplifier of the same type as claimed in claim 31 connected to operate in push-pull therewith, the emitter electrodes of said second transistors of each of these amplifiers being connected together, whereby these amplifiers provide each other with their respective said signal by-pass circuits.

34. An amplifier as claimed in claim 30 wherein said network which has a path conductive for direct current but not for signal current comprises a third transistor of the same conductivity type as said second transistor and having base, emitter and collector electrodes, a resistive element connected the base electrode of said third transistor to its collector electrode and a signal by-pass circuit connected to the base electrode of said third transistor to by-pass signal away therefrom, said third transistor collector electrode being connected to said first transistor collector electrode, and said third transistor emitter electrode being connected to said current source.

35. An amplifier as claimed in claim 34 wherein said resistive element comprises a series connection of a plurality of diodes.

36. A combination of a first transistor, said first transistor being a bipolar transistor of a first conductivity type and having a base and an emitter and a collector electrodes, and means for connecting said first transistor in a common-emitter amplifier configuration, said means comprising:

input, common and output terminals for signal respectively connected to the base, the emitter and the collector electrodes of said first transistor;

a current source having a first terminal connected to said common terminal, having a second terminal, and maintaining a predetermined level of current flow between its said first and said second terminals;

impedance network means for providing a path between a first and a second of its terminals of relatively low conductivity for signal current and relatively high conductivity for direct current, the first terminal thereof being connected to said first transistor collector electrode and the second terminal thereof being connected to the second terminal of said current source;

a second transistor, being of a second conductivity type complementary to said first conductivity type, and having base and emitter and collector electrodes; and means for connecting said second transistor as a common-base amplifier in a direct current feedback collector-to-base connection of said first transistor, which means includes a connection of the emitter electrode of said second transistor to the second terminal of said impedance network means and includes a connection of the collector electrode of said second transistor to the base electrode of said first transistor.

37. The combination set forth in claim 36 wherein said impedance network means comprises:

a resistive path between the first and second terminals of said impedance network means; and capacitance for by-passing at least a point along said resistive path to a point of fixed potential as referred to the potential at said common terminal.

38. The combination set forth in claim 36 wherein said impedance network means comprises:

a third transistor, being of said second conductivity type, having collector and emitter electrodes respectively connected to the first and the second terminals of said impedance network means, and having a base electrode;

direct current conductive means connecting the collector of said third transistor to its base electrode; and a capacitor connected between the base electrode of said third transistor and a point of fixed potential as referred to the potential at said common terminal.

39. The combination set forth in claim 38 wherein said direct current conductive means comprises a plurality of diodes connected serially between the collector and base electrodes of said third transistor and poled for forward conduction.

* * * * *